(12) United States Patent
Kim et al.

(10) Patent No.: US 12,125,687 B2
(45) Date of Patent: Oct. 22, 2024

(54) SYSTEM OF SEMICONDUCTOR PROCESS AND CONTROL METHOD THEREOF

(71) Applicant: SAMSUNG ELECTRONICS CO., LTD., Suwon-si (KR)

(72) Inventors: Youngdo Kim, Hwaseong-si (KR); Sungyong Lim, Seoul (KR); Daewon Kang, Seoul (KR); Sungyeol Kim, Yongin-si (KR); Sangki Nam, Seongnam-si (KR); Myunggeun Song, Seoul (KR); Byungkook Cho, Seongnam-si (KR); Hyeoncheol Jin, Hwaseong-si (KR); Jonghun Pi, Gyeongsangbuk-Do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 187 days.

(21) Appl. No.: 17/709,613

(22) Filed: Mar. 31, 2022

(65) Prior Publication Data

US 2023/0005723 A1 Jan. 5, 2023

(30) Foreign Application Priority Data

Jul. 2, 2021 (KR) .................. 10-2021-0087089

(51) Int. Cl.
*H01J 37/32* (2006.01)
*H01L 21/683* (2006.01)

(52) U.S. Cl.
CPC .. *H01J 37/32715* (2013.01); *H01J 37/32183* (2013.01); *H01J 37/32935* (2013.01);
(Continued)

(58) Field of Classification Search
CPC ......... H01L 21/67155; H01L 21/67069; H01L 21/68757; H01L 21/67213; H01L 21/6833;
(Continued)

(56) References Cited

U.S. PATENT DOCUMENTS 7,582,491 B2  9/2009  Sasaki et al.
8,143,904 B2  3/2012  Shih et al.
(Continued)

FOREIGN PATENT DOCUMENTS

CN   105717337   6/2016
CN   108332689   7/2018
(Continued)

*Primary Examiner* — Kevin J Comber
(74) *Attorney, Agent, or Firm* — F. Chau & Associates, LLC

(57) ABSTRACT

A semiconductor processing system includes: a semiconductor processing chamber including an electrostatic chuck disposed in a chamber housing, and a first power supplier for supplying first radio frequency (RF) power to an internal electrode disposed in the electrostatic chuck; a voltage measuring device for measuring a voltage corresponding to the first RF power to output a digital signal; and a control device for outputting an interlock control signal to the semiconductor processing chamber, when it is determined that the voltage increases to be within a predetermined reference range based on the digital signal. The electrostatic chuck is configured to enable a wafer to be seated on a surface of the electrostatic chuck.

19 Claims, 11 Drawing Sheets

(52) U.S. Cl.
CPC ............... *H01J 2237/24564* (2013.01); *H01J 2237/3341* (2013.01); *H01L 21/6833* (2013.01)

(58) Field of Classification Search
CPC ........... H01J 37/32715; H01J 37/32183; H01J 37/32935; H01J 2237/3341; H01J 2237/24564
USPC ........................................................ 361/234
See application file for complete search history.

(56) References Cited

U.S. PATENT DOCUMENTS

| | | | |
|---|---|---|---|
| 8,149,562 | B2 | 4/2012 | Hsu et al. |
| 10,804,821 | B2 | 10/2020 | Wang et al. |
| 2004/0031699 | A1* | 2/2004 | Shoji .................. H01L 21/6833 205/791.5 |
| 2005/0183669 | A1* | 8/2005 | Parkhe ................ H01L 21/6831 118/724 |
| 2006/0081564 | A1* | 4/2006 | Moroz ............... H01J 37/32935 219/121.43 |
| 2009/0044748 | A1* | 2/2009 | Pipitone .............. H01J 37/3299 118/697 |
| 2010/0008016 | A1 | 1/2010 | Onate et al. |
| 2016/0372933 | A1 | 12/2016 | Voronin et al. |
| 2018/0337026 | A1* | 11/2018 | Firouzdor ......... C23C 16/45525 |

FOREIGN PATENT DOCUMENTS

| | | |
|---|---|---|
| JP | 2695436 | 12/1997 |
| JP | 2002222850 | 8/2002 |
| JP | 5773635 | 9/2015 |
| KR | 10-2007-0068610 | 7/2007 |
| KR | 10-2019-0048413 | 5/2019 |

\* cited by examiner

SYSTEM OF SEMICONDUCTOR PROCESS AND CONTROL METHOD THEREOF

CROSS-REFERENCE TO RELATED APPLICATION(S)

This U.S. non-provisional patent application claims benefit of priority under 35 U.S.C. 119(a) to Korean Patent Application No. 10-2021-0087089 filed on Jul. 2, 2021 in the Korean Intellectual Property Office, the disclosure of which is incorporated by reference herein in its entirety.

1. TECHNICAL FIELD

The present inventive concept relates to a semiconductor processing system and a method thereof.

2. DISCUSSION OF RELATED ART

A semiconductor processing system is used to manufacture a semiconductor device. The semiconductor processing system may include a semiconductor processing chamber to performing a semiconductor process to form the semiconductor device, and a control device for controlling the semiconductor processing chamber. The semiconductor processing chamber may include an electrostatic chuck. A semiconductor wafer is placed on the electrostatic chuck to become a target of the semiconductor process. The semiconductor wafer may not be formed properly if the electrostatic chuck becomes damaged during the semiconductor process.

An operation of the semiconductor processing chamber can be stopped periodically so it can be determined whether or not the electrostatic chuck has become deteriorated. The electrostatic chuck is replaced if it is determined that the electrostatic chuck has become deteriorated and then the operation can be restarted. A jig in a separate stage may be used to determine whether the electrostatic chuck has become deteriorated. However, manufacture of semiconductor devices takes longer due to this constant stopping and starting of the operation. Further, use of the separate stage increases the cost of manufacturing semiconductor devices.

SUMMARY

At least one embodiment of the present inventive concept provides a semiconductor processing system for minimizing stoppages in an operation of a semiconductor processing chamber and monitoring a state of an electrostatic chuck to increase a yield of a semiconductor process, by monitoring deterioration of an electrostatic chuck in real time and determining whether or not the electrostatic chuck is to be replaced, while the semiconductor processing chamber is operating, and a method thereof.

According to an embodiment of the present inventive concept, a semiconductor processing system, includes: a semiconductor processing chamber including an electrostatic chuck disposed in a chamber housing, and a first power supplier for supplying first radio frequency (RF) power to an internal electrode disposed in the electrostatic chuck; a voltage measuring device for measuring a voltage corresponding to the first RF power to output a digital signal; and a control device for outputting an interlock control signal to the semiconductor processing chamber, when it is determined that the voltage increases to be within a predetermined reference range based on the digital signal. The electrostatic chuck is configured to enable a wafer to be seated on a surface of the electrostatic chuck.

According to an embodiment of the present inventive concept, a semiconductor processing system, includes: a plurality of semiconductor processing chambers each including a chamber housing, and a radio frequency (RF) power supplier for supplying RF power to an electrode inside the chamber housing; a plurality of voltage measuring devices for measuring a voltage corresponding to the RF power from the plurality of semiconductor processing chambers to output a digital signal; a plurality of control devices for outputting an interlock control signal to at least one of the plurality of semiconductor processing chambers based on the digital signal; and a data server for adjusting at least one of a plurality of operating parameters applied to convert the voltage into the digital signal in each of the plurality of voltage measuring devices based on raw data received from the plurality of voltage measuring devices.

According to an embodiment of the present inventive concept, a method of controlling a semiconductor processing system is provided. The method includes: performing a semiconductor process by operating a semiconductor processing chamber after replacing an electrostatic chuck; detecting a voltage corresponding to radio frequency (RF) power supplied to the semiconductor processing chamber, while the semiconductor process is performed; converting the voltage into a digital signal; and stopping an operation of the semiconductor processing chamber when it is determined that the voltage increases to be within a predetermined reference range based on the digital signal.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments of the present inventive concept will be described in detail with reference to the accompanying drawings.

Figure 1:
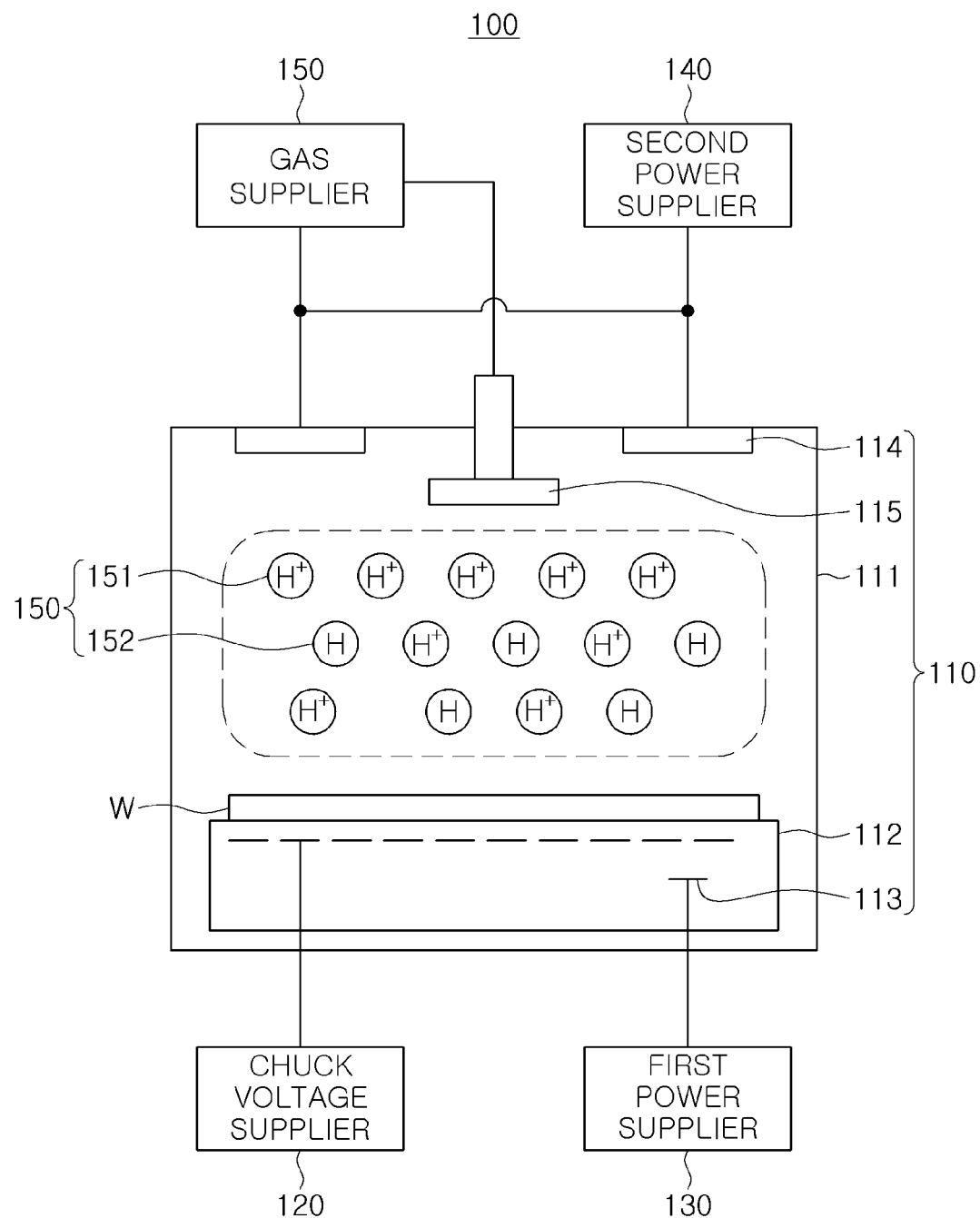
FIG. 1 is a schematic diagram illustrating a semiconductor processing chamber included in a semiconductor processing system according to an example embodiment of the present inventive concept.

FIG. 1 is a schematic diagram illustrating a semiconductor processing chamber included in a semiconductor processing system according to an example embodiment of the present inventive concept.

Referring to FIG. 1, a semiconductor processing chamber 100 according to an example embodiment of the present inventive concept may be a device for performing a semiconductor process using plasma. The semiconductor processing chamber 100 may include a chamber 110, a chuck voltage supplier 120, a first radio frequency (RF) power supplier 130, a second RF power supplier 140, and a gas inlet unit 150. The semiconductor processing chamber 100 may include additional components not shown in FIG. 1. For example, the chuck voltage supplier 120, the RF power supplier 130 or the second RF power supplier 140 may be implemented by a voltage generator or a power supply.

The chamber 110 may include a chamber housing 111, an electrostatic chuck (ESC) 112, an internal electrode 113 formed inside the electrostatic chuck 112, an upper electrode 114, and a gas inlet 115. The internal electrode 113 and the upper electrode 114 may be implemented with a conductor. A wafer W, a target of a semiconductor process, may be seated on the electrostatic chuck 112. In an embodiment, a ceramic coating layer is formed in a region of the electrostatic chuck 112 in direct contact with the wafer W. The ceramic coating layer may be formed of aluminum oxide ($Al_2O_3$), aluminum nitride (AlN), silicon carbide (SiC), or the like, and may have a thickness of about 1 mm. However, a material and a thickness of the ceramic coating layer may be variously modified according to example embodiments.

In an example embodiment, the wafer W may be fixed to the electrostatic chuck 112 while seated on the electrostatic chuck 112 by a voltage supplied by the chuck voltage supplier 120. For example, the chuck voltage supplier 120 may supply a constant voltage to the electrostatic chuck 112, and the constant voltage may have a magnitude of several hundreds to several thousands of volts. The chuck voltage supplier 120 may be connected to an electrode (e.g., a conductor) inside the electrostatic chuck 112 to supply the constant voltage, and the electrode inside the electrostatic chuck 112 may be located to face substantially an entire surface of the wafer W.

Reactive gas may be introduced through the gas inlet 150 to begin the semiconductor process. The first RF power supplier 130 may supply first RF power to the internal electrode 113 formed in the electrostatic chuck 112, and the second RF power supplier 140 may supply second RF power to the electrostatic chuck 112 and the upper electrode 114 located above the wafer W.

Each of the first RF power supplier 130 and the second RF power supplier 140 may include a high frequency power source for supplying bias power. Plasma 150 including radicals 151 and ions 152 of the reactive gas may be generated by the first RF power and the second RF power, and the reactive gas may be activated by the plasma 150 to increase the reactivity. For example, when the semiconductor process device 100 is an etching device, radicals 151 and ions 152 of the reactive gas may be concentrated on the wafer W by the first RF power supplied from the first RF power supplier 130 to the internal electrode 113. At least a portion of a semiconductor substrate or layers included in the wafer W may be dry-etched by radicals 151 and ions 152 of the reactive gas.

A self-bias voltage may be generated above the wafer W by the first RF power and the second RF power supplied to the internal electrode 113 and the upper electrode 114, respectively. In an example embodiment, the first RF power supplied to the internal electrode 113 may be several thousand to several tens of thousands of watts, and as a result, a self-bias voltage of minus several thousand volts may be formed above the wafer W.

As described above, the electrostatic chuck 112 may include a ceramic coating layer in direct contact with the wafer W. In an embodiment, the ceramic coating layer is formed of a ceramic dielectric. When the semiconductor process for the wafer W is finished, the wafer W may be carried out externally by a load lock chamber connected to the chamber 110, and a new wafer W for performing a semiconductor process may be transferred to the chamber 110. The electrostatic chuck 112 may be exposed to the inside of the chamber 110 while the wafer W is replaced. Accordingly, the electrostatic chuck 112 may be damaged by radicals 151 and ions 152 included in the plasma 150 formed above the electrostatic chuck 112. For example, the ceramic coating layer of the electrostatic chuck 112 exposed to the plasma 150 while replacing the wafer W may be damaged by the radicals 151 and the ions 152.

Meanwhile, a lower surface of the wafer W may be in direct contact with a plurality of convex portions formed on the electrostatic chuck 112, and a space between the plurality of convex portions and the lower surface of the wafer W may be filled with gas for cooling. For example, the gas for cooling may be helium (He) gas. While the semiconductor process is performed, a chuck voltage of hundreds to thousands of volts may be supplied to the electrostatic chuck 112, and a self-bias voltage of minus several thousand volts may be generated on an upper surface of the wafer W. Due to such a voltage difference, an unintentional discharge may occur in the helium gas injected for the purpose of cooling the wafer W, and the electrostatic chuck 112 may be damaged due to such a discharge. For example, a crack may occur in the ceramic coating layer of the electrostatic chuck 112 while the helium gas is discharged.

The wafer W may not be properly fixed on the electrostatic chuck 112 when the electrostatic chuck 112 is damaged. An operation of the semiconductor processing chamber 100 may be stopped to determine whether the electrostatic chuck 112 is damaged. The electrostatic chuck 112 may be carried out externally to determine whether the electrostatic chuck 112 is damaged. However, manufacturing time is increased since the operation of the semiconductor processing chamber 100 is stopped, and it may take a large amount of time to inspect damage to the electrostatic chuck 112.

In an example embodiment of the present inventive concept, by detecting damage to the electrostatic chuck 112 as a voltage change, it may be determined whether replacement of the electrostatic chuck 112 is necessary in real time without stoppages in an operation of the semiconductor processing chamber 100. Accordingly, it is possible to increase a yield of the semiconductor process by minimizing stoppages in the operation of the semiconductor processing chamber 100, monitoring a state of the electrostatic chuck 112 in real time, and replacing the electrostatic chuck 112 at an appropriate time, when replacement is required.

FIGS. 2 to 5 are diagrams illustrating an operation of a semiconductor processing system according to an example embodiment of the present inventive concept.

Figure 2:
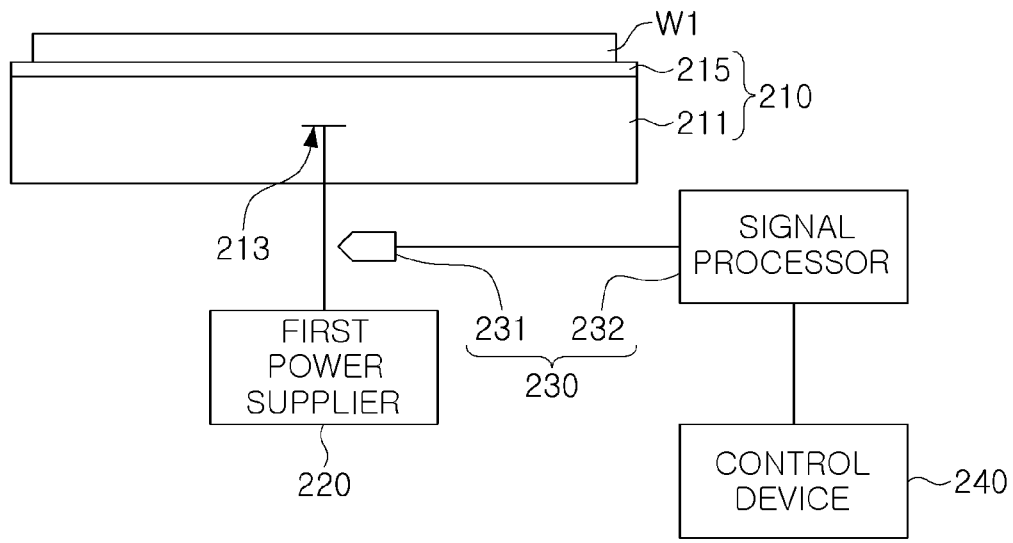
FIGS. 2 to 5 are diagrams illustrating an operation of a semiconductor processing system according to an example embodiment of the present inventive concept.

Referring to FIG. 2, a semiconductor processing system 200 according to an example embodiment of the present inventive concept may include an electrostatic chuck 210 on which a first wafer W1 is seated, a first power supplier 220 supplying first RF power to an internal electrode 213 of the electrostatic chuck 210, a voltage measuring device 230, and a control device 240. The electrostatic chuck 210 may include a plate 211, an internal electrode 213 inside the plate 211, and a ceramic coating layer 215 in contact with the first wafer W1 above the plate 211. The voltage measuring device 230 may include an RF voltage measuring circuit 231 and a signal processor 232.

When the first wafer W1 is seated and fixed above the electrostatic chuck 210 and a semiconductor process is started, the first power supplier 220 may supply first RF power to the internal electrode 213. As described above, the first RF power of several thousand to tens of thousands of watts may be supplied to the internal electrode 213.

The RF voltage measuring circuit 231 and the signal processor 232 may provide a voltage measuring device. For example, the RF voltage measurement circuit 231 may include an RF pick-up in which an accuracy of voltage measurement is set to 99% or more, and may measure a voltage corresponding to the first RF power between the first power supplier 220 and the internal electrode 213. The voltage measured by the RF voltage measuring circuit 231 may be converted into a digital signal by the signal processor 232, and the digital signal may be input to the control device 240. The signal processor 232 may include an analog to digital converter to the measured analog voltage into the digital signal.

The control device 240 may be a device for controlling a semiconductor processing chamber including the electrostatic chuck 210 and the first power supplier 220. The control device 240 may determine variations in a voltage corresponding to the first RF power using the digital signal received from the signal processor 232. In an example embodiment, when it is determined that the voltage corresponding to the first RF power has increased to a predetermined reference voltage, the control device 240 may determine a replacement timing of the electrostatic chuck 210 due to damage to the electrostatic chuck 210, and may output an interlock control signal for stopping an operation of the semiconductor processing chamber.

Figure 3:
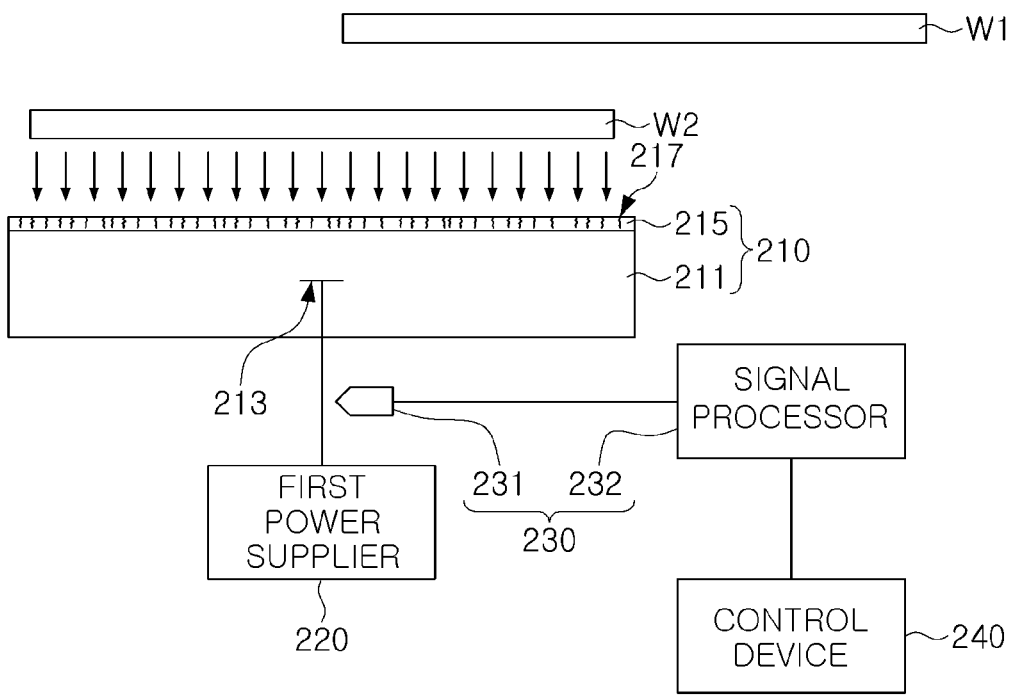

Referring to FIG. 3, when a semiconductor process for a first wafer W1 is finished and the first wafer W1 is separated from the electrostatic chuck 210, a new second wafer W2 may be seated on the electrostatic chuck 210. However, in a process of replacing the first wafer W1 with the second wafer W2, a surface of the electrostatic chuck 210, for example, a surface of the ceramic coating layer 215 in direct contact with the wafers W1 and W2 may be exposed externally. While the ceramic coating layer 215 is exposed externally, a plurality of cracks 217 may be formed in the ceramic coating layer 215 by radicals and/or ions of plasma existing above the electrostatic chuck 210.

When the crack 217 is formed in the ceramic coating layer 215, a contact area between the second wafer W2 and the ceramic coating layer 215 may be reduced. As a result, the second wafer W2 may not be sufficiently fixed on the electrostatic chuck 210. Accordingly, a desired pattern may not be accurately formed on the second wafer W2 because a positional movement of the second wafer W2 occurs during the semiconductor process.

The ceramic coating layer 215 may be a dielectric disposed between the internal electrode 213 of the electrostatic chuck 210 and the wafers W1 and W2. The dielectric may be modeled as one or more capacitors. When a crack 217 occurs in the ceramic coating layer 215, a capacitance of the capacitor modeling the ceramic coating layer 215 decreases.

As the number of cracks 217 formed in the ceramic coating layer 215 and an area of the cracks 217 increase, a magnitude of the voltage measured by the RF voltage measuring circuit 231 may increase. By comparing a predetermined reference voltage or a predetermined reference range with the voltage measured by the RF voltage measuring circuit 231, the control device 240 may determine a replacement timing of the electrostatic chuck 210 due to the crack 217 of the ceramic coating layer 215. In an embodiment, replacement of the electrostatic chuck 210 due to the crack 217 is determined to be needed when the measured voltage exceeds the predetermine voltage.

Figure 4:
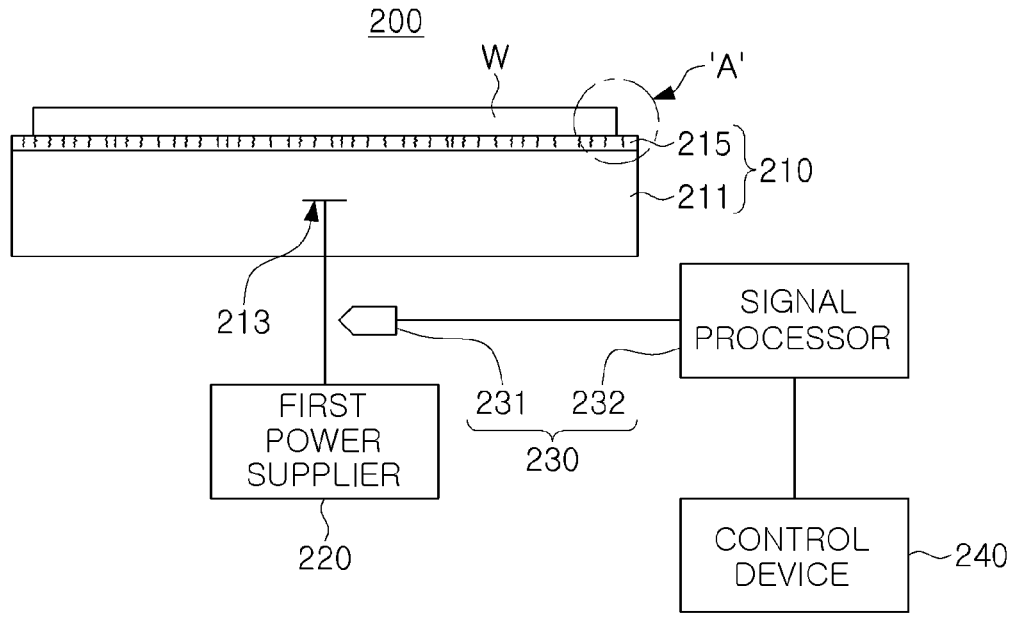

Next, referring to FIG. 4, the semiconductor processing system 200 according to an example embodiment of the present inventive concept may perform a semiconductor process on the wafer W seated on the electrostatic chuck 210. As described above, the electrostatic chuck 210 may include a plate 211, an internal electrode 213 inside the plate 211 and a ceramic coating layer 215 in contact with a first wafer W1 above the plate 211. A first RF supply may be supplied to the internal electrode 213 of the electrostatic chuck 210 by a first power supplier 220, and the semiconductor processing system may further include an RF voltage measurement circuit 231, a signal processor 232 and a control device 240.

Figure 5:
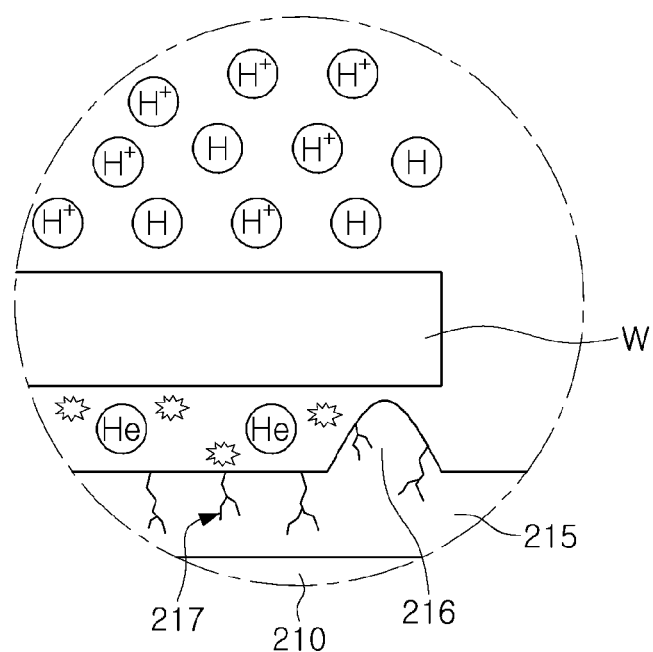

Referring to FIG. 5, an enlarged view of region 'A' of FIG. 4, the wafer W may be seated on a plurality of protrusions 216 formed above the ceramic coating layer 215 in the electrostatic chuck 210. Accordingly, as shown in FIG. 5, a space may be created between a lower surface of the wafer W and an upper surface of the ceramic coating layer 215, and between the plurality of protrusions 216. Helium gas, or the like, may be injected into the space for the purpose of cooling the wafer W while the semiconductor process is in progress.

However, when high bias power is supplied to the internal electrode 213 of the electrostatic chuck 210 to perform a semiconductor process using plasma, an unintentional discharge may be generated in the helium gas and applied to the wafer W to damage the ceramic coating layer 215. The damage to the ceramic coating layer 215 due to a discharge of the helium gas may appear as cracks 217 in the ceramic coating layer 215 and the plurality of protrusions 216, as shown in FIG. 5.

As described above, as the number and an area of cracks 217 generated in the ceramic coating layer 215 increases, a capacitance of a capacitor modeling the ceramic coating layer 215 may decrease. In an example embodiment of the present inventive concept, a replacement timing of the electrostatic chuck 210 can be quickly detected without stopping the operation of the semiconductor processing system 200 by monitoring an increase in voltage due to a decrease in capacitance in real time using a voltage measuring device.

Figure 6:
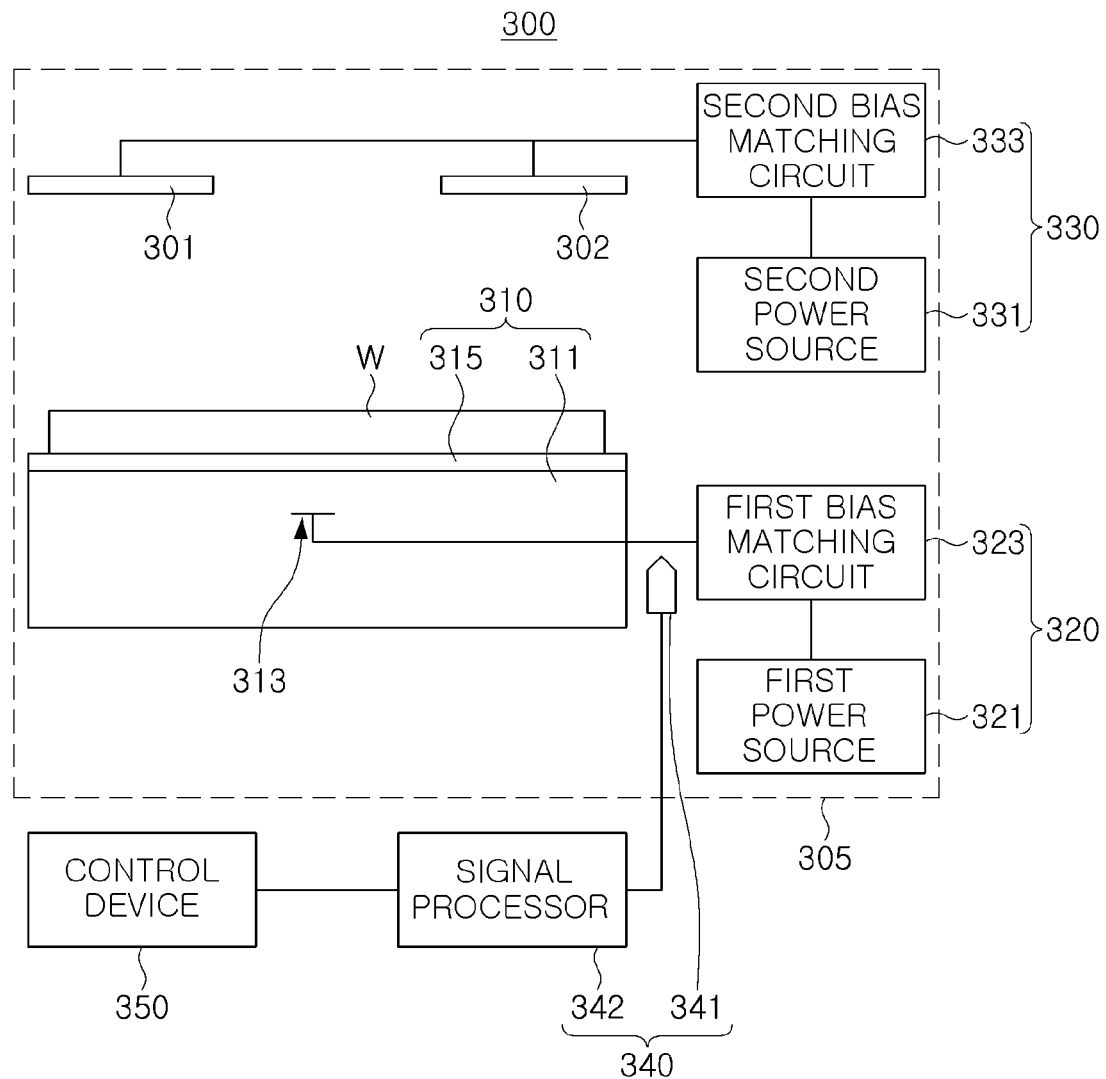
FIGS. 6 and 7 are diagrams illustrating an operation of a semiconductor processing system according to an example embodiment of the present inventive concept.
Figure 7:
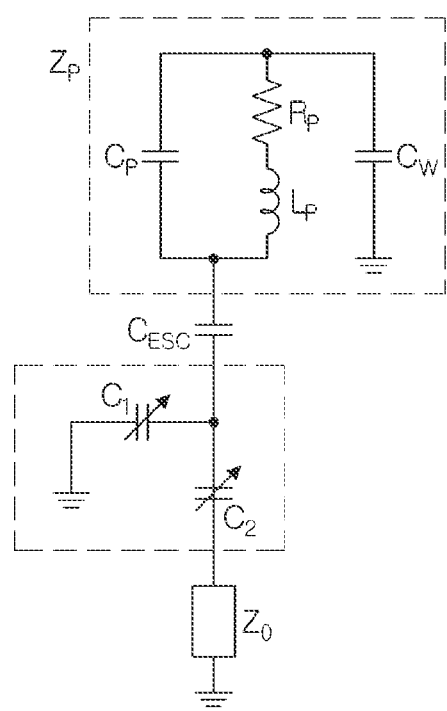

FIGS. 6 and 7 are diagrams illustrating an operation of a semiconductor processing system according to an example embodiment of the present inventive concept.

Referring first to FIG. 6, a semiconductor processing system 300 according to an example embodiment of the present inventive concept may include an electrostatic chuck 310, a first power supplier 320, a second power supplier 330, a voltage measuring device 340 and a control device 350. In addition, a chuck voltage supplier for supplying a constant voltage for fixing a wafer W on the electrostatic chuck 310 to the electrostatic chuck 310, a gas supplier for injecting gas for a semiconductor process into a chamber 305 and evacuating the gas from the chamber 305, and the like, may be further included in the semiconductor processing system 300.

The electrostatic chuck 310 may include a plate 311, an internal electrode 313 and a ceramic coating layer 315. The internal electrode 313 may be embedded in the plate 311, and may be connected to the first power supplier 320 to receive first RF power. A wafer W may be seated on the ceramic coating layer 315.

Each of the first power supplier 320 and the second power supplier 330 may supply power to the internal electrode 313 and the upper electrodes 301 and 302, and may include power sources 321 and 331 and bias matching circuits 323 and 333. The first power supplier 320 may include a first power source 321, a high frequency power source, and a first bias matching circuit 323. The second power supplier 330 may include a second power source 331, also a high frequency power source, and a second bias matching circuit 333.

For example, plasma including radicals and ions may be formed above the electrostatic chuck 310 with power supplied to the upper electrodes 301 and 302 by the second power supplier 330. In addition, radicals and ions formed above the electrostatic chuck 310 may be accelerated toward the electrostatic chuck 310 by the power supplied to the internal electrode 313 by the first power supplier 320. According to the above-described principle, the semiconductor process equipment may perform a semiconductor process such as an etching process, a deposition process, or the like.

The control device 350 may control an overall operation of the semiconductor processing system 300. In an example embodiment of the present inventive concept, the control device 350 may control a chuck voltage supplied to the electrostatic chuck 310, first RF power supplied by the first supplier 320 to the internal electrode 313, and second RF power supplied by the second power supplier 330 to the upper electrodes 301 and 302. In addition, the control device 350 may be connected to a voltage measuring device 340 detecting a voltage corresponding to first RF power between the first bias matching circuit 323 and the internal electrode 313. The control device 350 may determine a replacement timing of the electrostatic chuck 310 using a detected voltage corresponding to the first RF power.

The voltage measuring device 340 may include an RF voltage measuring circuit 341 including an RF pickup calibrated to have an inaccuracy within 1%, and a signal processor 342. The signal processor 342 may convert an analog signal type-voltage measured by the RF pickup into a digital signal by signal processing, and may include a filter, an attenuator, an amplifier, an analog-to-digital converter, and the like.

The control device 350 may detect variations in a voltage corresponding to first RF power based on a digital signal output from the voltage measuring device 340, and determine a replacement timing of the electrostatic chuck 310 based on the detection. For example, when a voltage corresponding to the first RF power increases up to a predetermined reference range and stays within the reference range for more than a predetermined reference time, the control device 350 may determine that the replacement timing of the electrostatic chuck 310 has arrived. For example, when the digital signal has a value within the predetermined reference range or within the predetermined reference range for more than predetermined reference time, the control device 350 may determine that the replacement timing of the electrostatic chuck 310 has arrived. In this case, the control device may output an interlock control signal to stop the operations of the first power supplier 320 and the second power supplier 330, and may output a replacement signal of the electrostatic chuck 310 as image/voice, or the like. For example, the control device 350 may determine that the electrostatic chuck 310 needs to be replaced if the detected voltage is between lower and upper voltages of the reference range for longer than the predetermined reference time. For example, the replacement signal may be output to a display as an image that indicates to a user that the electrostatic chuck 310 needs to be replaced. The image may indicate the location of the electrostatic chuck 310 when several are present. For example, the replacement signal may be output to a speaker as a sound or spoken phrase that indicates to a user that the electrostatic chuck 310 needs to be replaced. The spoken phrase may also indicate the location of the electrostatic chuck 310 when several are present.

FIG. 7 may be an equivalent circuit diagram electrically modeling the semiconductor processing system 300 described with reference to FIG. 6.

Referring to FIG. 7, a first power source 321 may be modeled as a first impedance $Z_0$, and variable capacitors $C_1$ and $C_2$ included in a first bias matching circuit 323 may be connected to the first impedance $Z_0$. An electrostatic chuck capacitor $C_{ESC}$ modeling a ceramic coating layer 315 of an electrostatic chuck 310 may be connected to the variable capacitors $C_1$ and $C_2$. Meanwhile, plasma formed above the electrostatic chuck 310 may be regarded as a conductive dielectric and may be modeled as a second impedance $Z_P$ including a plasma capacitor $C_P$, a plasma resistor $R_P$, and a plasma inductor $L_P$, and upper electrodes 301 and 302 connected to the second power supplier 330 may be modeled as an upper capacitor $C_W$.

An RF voltage measuring circuit 341 may measure a voltage corresponding to RF power between the first bias matching circuit 323 and the electrostatic chuck 310 as shown in FIG. 6. Accordingly, in the equivalent circuit shown in FIG. 7, the RF voltage measuring circuit 341 may measure a voltage between the variable capacitors $C_1$ and $C_2$ and the electrostatic chuck capacitor $C_{ESC}$.

When damage such as a crack, or the like, occurs in the ceramic coating layer 315 of the electrostatic chuck 310, a defect may occur in a contact state between the ceramic coating layer 315 and the wafer W. As a result, capacitance of the electrostatic chuck capacitor $C_{ESC}$ may be reduced. As an absolute value of the impedance $Z_P$ increases, the voltage measured by the RF voltage measuring circuit 341 may increase. When an increase in the voltage measured by the RF voltage measuring circuit 341 is detected, the control device 350 may determine that a replacement timing has arrived because the electrostatic chuck 310 is damaged, and output an interlock control signal to stop the operations of the first power supplier 320 and the second power supplier 330.

Figure 8:
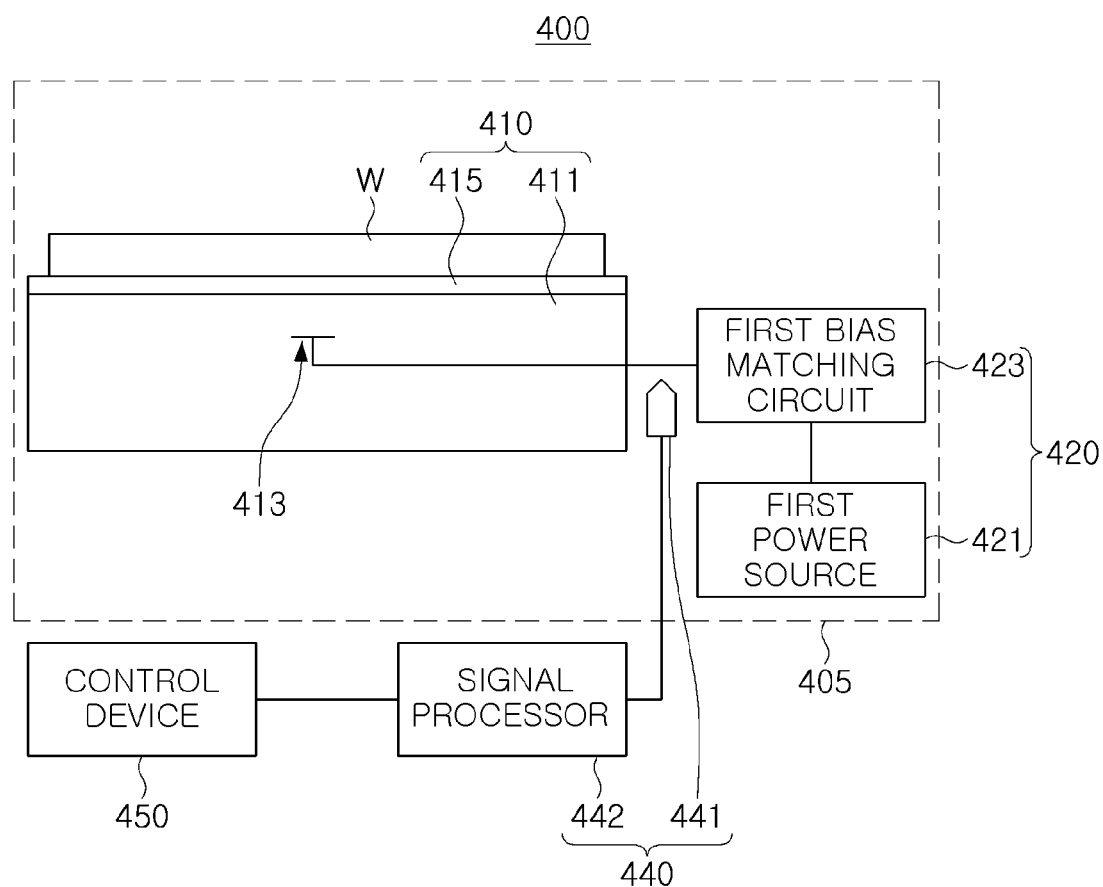
FIGS. 8 and 9 are diagrams illustrating an operation of a semiconductor processing system according to an example embodiment of the present inventive concept.
Figure 9:
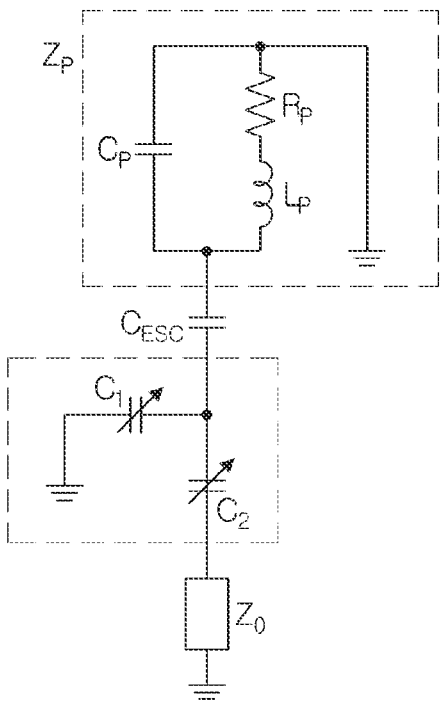

FIGS. 8 and 9 are diagrams illustrating an operation of a semiconductor processing system according to an example embodiment of the present inventive concept.

Referring to FIG. 8, a semiconductor processing system 400 according to an example embodiment of the present inventive concept may include an electrostatic chuck 410, a first power supply 420, a voltage measurement device 440, and a control device 450. The electrostatic chuck 410 may include a plate 411, an internal electrode 413 and a ceramic coating layer 415. As compared with the example embodiment shown in FIG. 6, in the semiconductor processing system 400 according to an example embodiment shown in FIG. 8, a second power supplier is omitted, or the second power supplier does not supply RF power to an upper electrode. The remaining configuration may be similar to the example embodiment described with reference to FIG. 6.

Since the second power supplier does not supply RF power above the wafer W and the electrostatic chuck 410, an equivalent circuit diagram modeling the semiconductor processing system 400 illustrated in FIG. 8 may appear different from that of FIG. 7. Referring to FIG. 9, the first power source 421 may be modeled as a first impedance $Z_0$, variable capacitors $C_1$ and $C_2$ included in a first bias matching circuit 423 may be connected to the first impedance $Z_0$. An electrostatic chuck capacitor $C_{ESC}$ modeling the ceramic coating layer 415 of the electrostatic chuck 410 may be connected to the variable capacitors $C_1$ and $C_2$. Meanwhile, plasma formed above the electrostatic chuck 410 is regarded as a conductive dielectric and is modeled as a second impedance $Z_P$ including a plasma capacitor $C_P$, a plasma resistor $R_P$, and a plasma inductor $L_P$. Since a second power supplier does not supply RF power above the wafer W, the second impedance $Z_P$ may be directly connected to a ground.

An overall operation of the semiconductor processing system 400 may be similar to that described with reference to FIGS. 6 and 7. An RF voltage measuring circuit 441 may measure a voltage corresponding to RF power between a first bias matching circuit 423 and the electrostatic chuck 410. As a result, in an equivalent circuit shown in FIG. 9, the RF voltage measuring circuit 441 may measure a voltage between the variable capacitors $C_1$ and $C_2$ and the electrostatic chuck capacitor $C_{ESC}$.

When damage such as a crack, or the like occurs in the ceramic coating layer 415 of the electrostatic chuck 410, a defect may occur in a contact state between the ceramic coating layer 415 and the wafer W. As a result, the measured voltage by the RF voltage measuring circuit 441 may increase as a result thereof. When an increase in the voltage measured by the RF voltage measuring circuit 441 is detected, the control device 450 may output an interlock control signal to stop the operation of the semiconductor processing system 400.

In example embodiment shown in FIGS. 7 and 9, the control devices 350 and 450 may output an interlock control signal when an increase in the measured voltage is sensed. In this case, considering that the measured voltage may vary due to other factors such noise, or the like, as well as damage to the electrostatic chucks 310 and 410, the control devices 350 and 450 may output an interlock control signal when the measured voltage has increased to a predetermined reference range or increased to a predetermined reference range for at least a certain amount of time. Hereinafter, it will be described in more detail with reference to FIG. 10.

Figure 10:
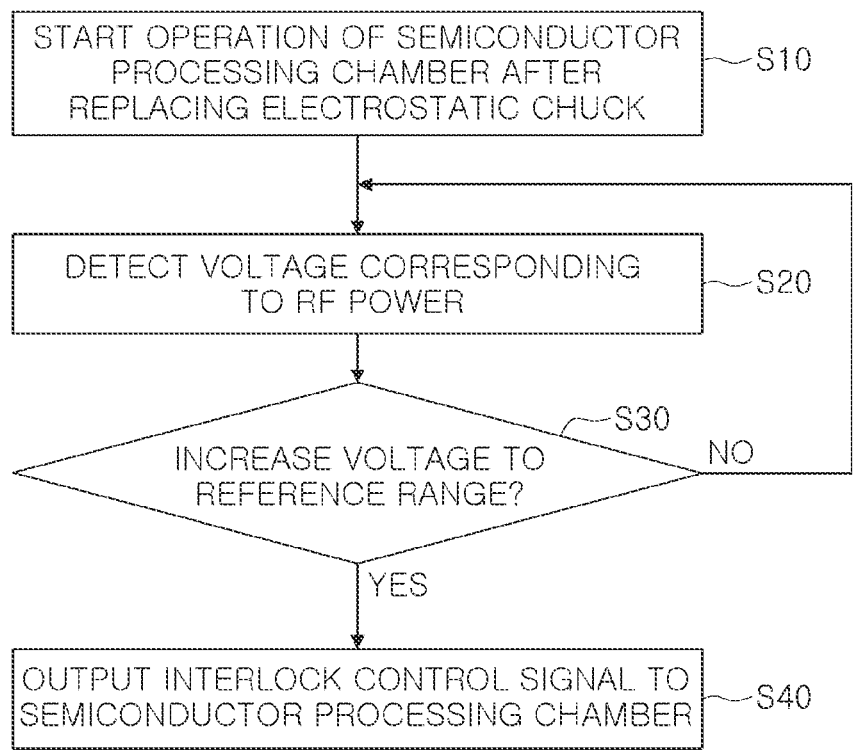
FIG. 10 is a flowchart illustrating a method of controlling a semiconductor processing system according to an example embodiment of the present inventive concept.
Figure 11:
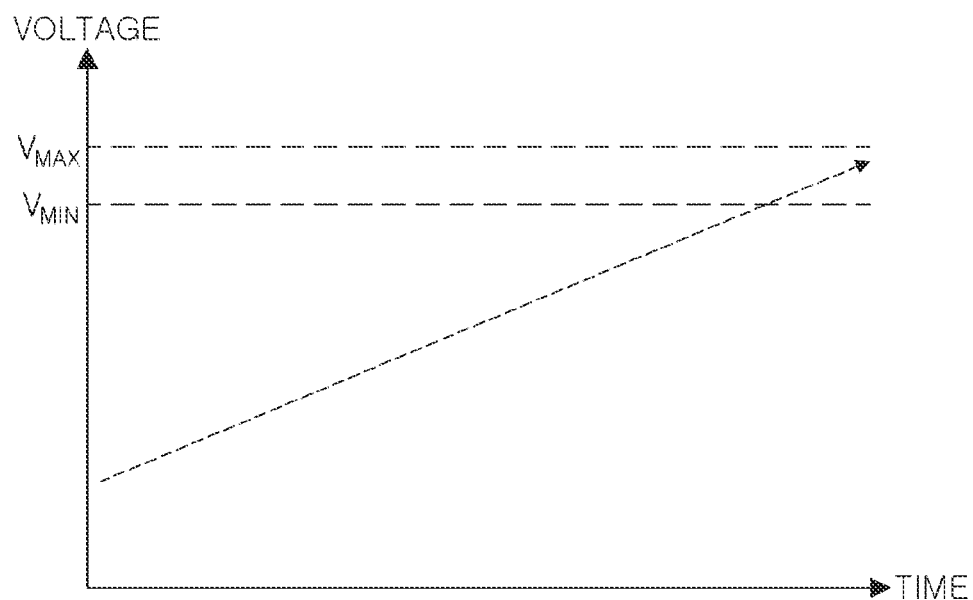
FIG. 11 is a graph illustrating a method of controlling a semiconductor processing system according to an example embodiment of the present inventive concept.

FIG. 10 is a flowchart illustrating a method of controlling a semiconductor processing system according to an example embodiment of the present inventive concept. FIG. 11 is a graph illustrating a method of controlling a semiconductor processing system according to an example embodiment of the present inventive concept.

Referring to FIG. 10, a method of controlling a semiconductor processing system according to an example embodiment of the present inventive concept includes starting an operation of a semiconductor processing chamber after replacing an electrostatic chuck (S10). The electrostatic chuck is a consumable having a lifespan. When it is determined that a lifespan of the electrostatic chuck is over, the electrostatic chuck may be replaced while the operation of the semiconductor processing chamber is stopped, and the semiconductor processing chamber may be started again.

Next, while the semiconductor processing chamber is operating, a voltage corresponding to RF power supplied to the semiconductor processing chamber is detected (S20). For example, the voltage corresponding to RF power may be measured in a path through which RF power is supplied to an internal electrode disposed inside the electrostatic chuck, and the measured voltage may be converted into a digital signal and transmitted to a control device connected to the semiconductor processing chamber.

The control device monitors whether the voltage has increased to a reference range based on the digital signal (S30). The reference range is a range defined by a predetermined minimum voltage and a maximum voltage. The control device may determine whether the voltage increases above the minimum voltage based on a digital signal. In this case, in consideration of a voltage increase due to noise, or the like, the control device may determine that the voltage has increased to be within a reference range only when the voltage increases to the reference range and does not decrease below the minimum voltage of the reference range for a predetermined time. For example, if the voltage remains within the reference range for the predetermined time, it may be concluded that the electrostatic chuck needs to be replaced.

If it is determined that the voltage has not increased to be within the reference range as a result of the determination in the operation of S30, the control device may continue to detect the voltage while maintaining the operation of the semiconductor processing chamber. On the other hand, if it is determined that the voltage has increased to the reference range as a result of the determination in the operation of S30, the control device may output an interlock control signal to the semiconductor processing chamber (S40). The operation of the semiconductor processing chamber may be stopped by the interlock control signal.

Referring to a graph of FIG. 11, since the semiconductor processing chamber continues to operate after the electrostatic chuck is replaced, a voltage measured in a path through which RF power is supplied to the internal electrode disposed inside the electrostatic chuck may gradually increase. A coupling state between the electrostatic chuck and a wafer may be deteriorated, or a leakage current may increase in the ceramic coating layer when the electrostatic chuck is damaged while the semiconductor processing chamber is operating.

The control device may monitor whether the measured voltage increases above a minimum voltage $V_{MIN}$ defining a reference range. However, according to example embodiments, considering that a voltage may temporarily increase above the minimum voltage $V_{MIN}$ due to a noise component or other causes, the voltage may increase above the minimum voltage $V_{MIN}$ and after a predetermined time elapses, the control device may output an interlock control signal to the semiconductor processing chamber. For example, the interlock control signal may not be output if the voltage increases above the minimum voltage $V_{MIN}$ but decreases below the minimum voltage before the predetermined time elapses.

Figure 12:
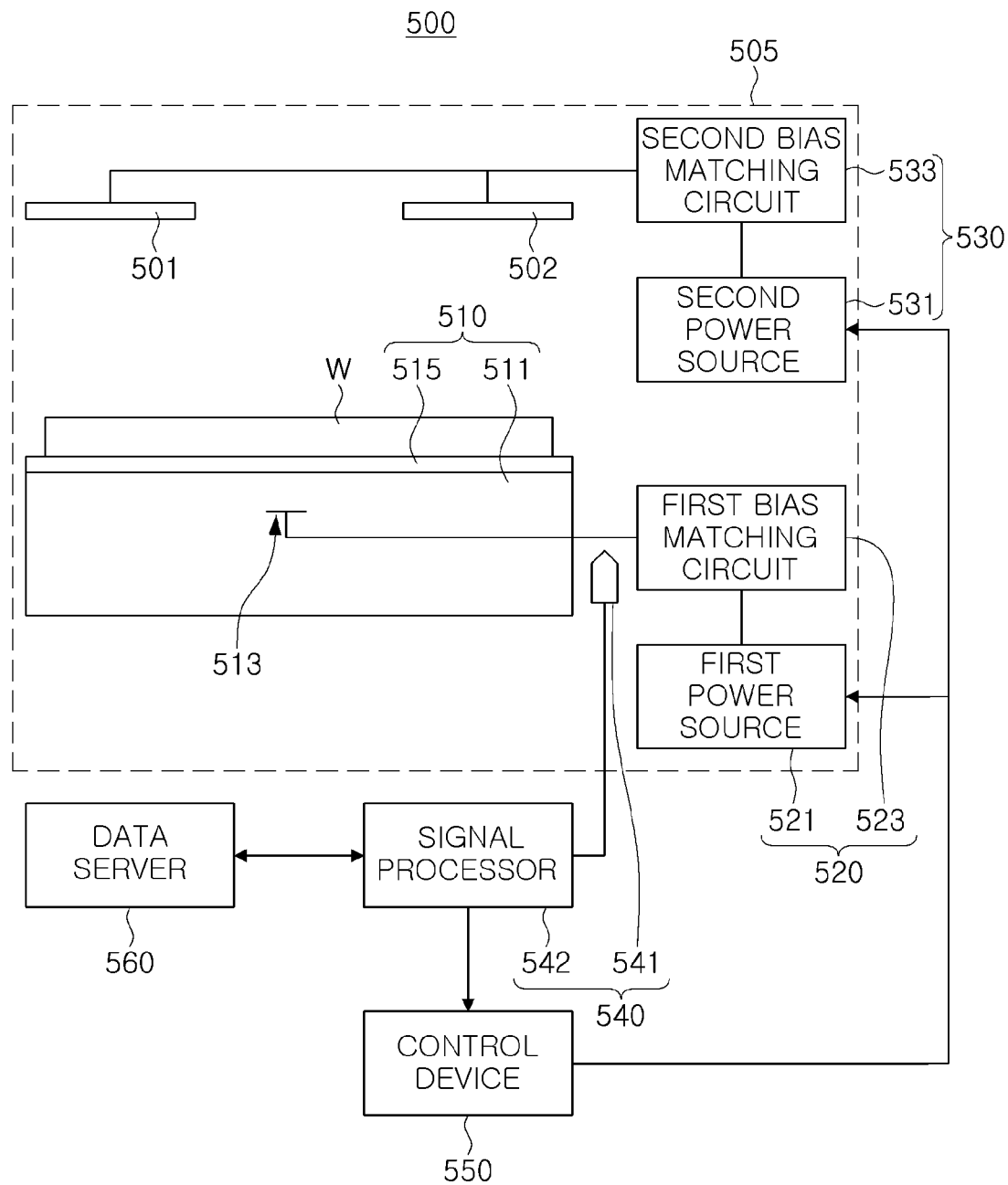
FIG. 12 is a diagram illustrating an operation of a semiconductor processing system according to an example embodiment of the present inventive concept.

FIG. 12 is a diagram illustrating an operation of a semiconductor processing system according to an example embodiment of the present inventive concept.

Referring to FIG. 12, a semiconductor processing system 500 may include an electrostatic chuck 510, a first power supply 520, a second power supply 530, a voltage measuring device 540, a control device 550, and a data server 560. As compared with the example embodiment shown in FIG. 6, the semiconductor processing system 500 according to the embodiment shown in FIG. 8 may further include a data server 560, and the remainder of the configuration may be similar to the example embodiment described with reference to FIG. 6. The electrostatic chuck 510 may include a plate 511, an internal electrode 513, and a ceramic coating layer 515.

The data server 560 may receive raw data from the signal processor 542 included in the voltage measuring device 540, and use the raw data continuously received from the signal processor 542 to improve interlock consistency of the semiconductor processing system 500. The data server 560 may accumulate and analyze the raw data received from the signal processor 542 at different time points, to adjust at least one of several operating parameters applied by the signal processor 542 to convert a measured voltage into a digital signal to improve interlock consistency.

For example, the data server 560 may optimize the operating parameters of each of the unit blocks included in the signal processor 542 so that the control device 550 can generate an interlock control signal under accurate conditions and at an accurate timing. For example, the signal processor 542 may include a filter, an attenuator, an amplifier, an analog-to-digital converter, and the like. The data server 560 may adjust at least one of a filtering band of a filter, a gain of an amplifier, an attenuation coefficient of an attenuator, and a full-scale voltage of an analog-to-digital converter by using the raw data received from the signal processor 542.

In an example embodiment, when the control device 550 outputs an interlock control signal when the voltage measured by the voltage measuring device 540 increases to a first voltage, and an operation of the semiconductor processing chamber is stopped, but the time for actually replacing the electrostatic chuck may not arrive. In this case, the semiconductor processing chamber may be operated again, and then, when the control device 550 outputs an interlock control signal, the operation of the semiconductor processing chamber may be stopped again.

In an example embodiment of the present inventive concept, the data server 560 may adjust at least one of the operation parameters of the signal processor 542 with reference to the case in which the replacement timing of the electrostatic chuck has not arrived. For example, the data server 560 may adjust the gain of the amplifier, the attenuation coefficient of the attenuator, and the like, under the condition that the voltage measured by the voltage measuring device 540 increases to the first voltage. As described above, the data server 560 may accumulate the raw data provided by the signal processor 542 such that the data server 560 adjusts at least one of the operating parameters of the signal processor 542, thereby improving interlock consistency of the semiconductor processing system 500 and accurately determining a replacement time of the electrostatic chuck.

Figure 13:
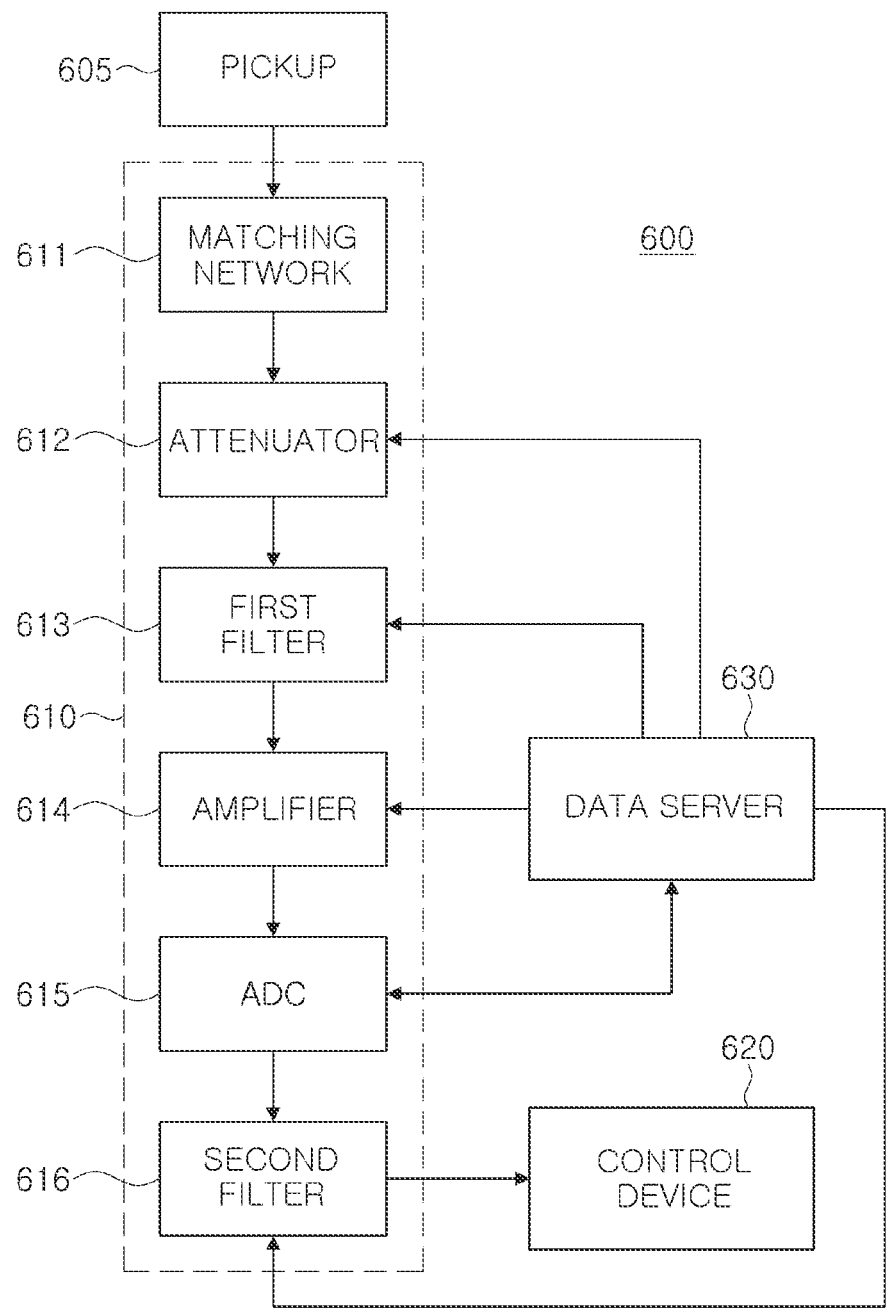
FIG. 13 is a view illustrating an operation of a semiconductor processing system according to an example embodiment of the present inventive concept.

FIG. 13 is a view illustrating an operation of a semiconductor processing system according to an example embodiment of the present inventive concept.

Referring to FIG. 13, a semiconductor processing system 600 according to an example embodiment of the present inventive concept may include an RF pickup 605, a signal processor 610, a control device 620, and a data server 630. The RF pickup 605 may include a circuit capable of measuring a voltage in a path through which RF power is supplied to the semiconductor processing chamber, and may be calibrated to have an inaccuracy of 1% or less. The RF pickup 605 may measure a voltage corresponding to RF power and output the voltage to the signal processor 610 in a form of an analog signal.

The signal processor 610 may include a matching network 611, an attenuator 612, a first filter 613, an amplifier 614, an analog-to-digital converter 615 and a second filter 616. However, the configuration of the signal processor 610 is not limited to that shown in FIG. 13, and some configurations thereof may be omitted or additional configurations may be further included. Alternatively, a dispositional order of the components 611 to 616 included in the signal processor 610 may be changed.

An analog signal received by the matching network 611 may be reduced in amplitude at the attenuator 612. The analog signal with reduced amplitude may be primarily filtered by the first filter 613. For example, a noise component of the analog signal may be partially removed by the first filter 613. At least one of an attenuation coefficient determining an amount by which the attenuator 612 reduces the amplitude of the analog signal, and a filtering band of the first filter 613 may be adjusted by the data server 630.

An output of the first filter 613 is input to the amplifier 614. The amplifier 614 may be, for example, a variable gain amplifier. The amplifier 614 may amplify a signal by a predetermined gain, and the gain of the amplifier may be adjusted by the data server 630. The analog signal amplified by the amplifier 614 may be converted into a digital signal by the analog-to-digital converter 615. The digital signal output from the analog-to-digital converter 615 may be filtered by the second filter 616, a digital filter, and may be provided to the control device 620. The control device 620 may determine whether a voltage measured by the RF pickup 605 has increased enough to generate an interlock control signal using the digital signal.

Meanwhile, data output from the analog-to-digital converter 615 may be provided to the data server 615 as raw data. The data server 615 may analyze the raw data to adjust an operating parameter of at least one of the attenuator 612, the first filter 613, the amplifier 614, the analog-to-digital converter 615, and the second filter 616. Accordingly, interlock consistency may be improved as time passes and raw data is accumulated.

However, according to example embodiments, the control device 620 rather than the signal processor 610 may provide data necessary for improving interlock consistency to the data server 630. The data server 630 may receive a digital signal at the time when the control device 620 generates an interlock control signal, or the like, and determine whether the time at which the interlock control signal is generated is appropriate, to adjust an operating parameter of at least one of the attenuator 612, the first filter 613, the amplifier 614, the analog-to-digital converter 615, and the second filter 616, which are included in the signal processor 610.

Figure 14:
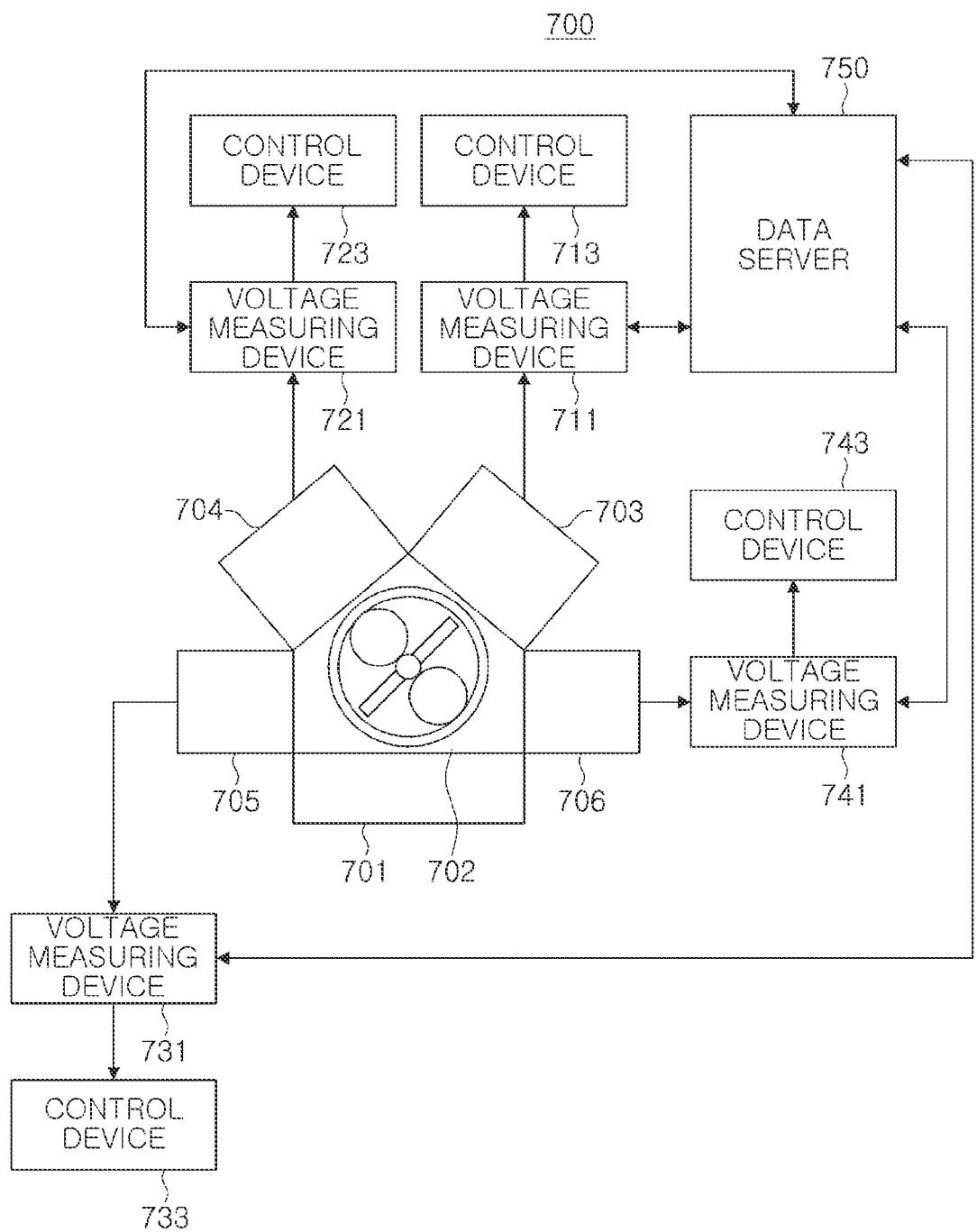
FIG. 14 is a diagram schematically illustrating a semiconductor processing system according to an example embodiment of the present inventive concept.

FIG. 14 is a view schematically illustrating a semiconductor processing system according to an example embodiment of the present inventive concept.

Referring to FIG. 14, a semiconductor processing system 700 according to an example embodiment of the present inventive concept may include a plurality of chambers 701 to 706. The plurality of chambers 701 to 706 may include a transfer chamber 701, a load lock chamber 702, and semiconductor processing chambers 703 to 706. The semiconductor processing chambers 703-706 may receive a wafer from the transfer chamber 701 and the load lock chamber 702 to perform a semiconductor process. For example, at least one of the semiconductor processing chambers 703 to 706 may be a plasma processing chamber performing an etching process or a deposition process by generating plasma including radicals and ions of a source gas.

As an example embodiment, a transfer robot may be provided in the transfer chamber 701, and the transfer robot may transfer wafers to the load lock chamber 702. The load lock chamber 702 may also include a transfer robot, and the transfer robot inside the load lock chamber 702 may transfer the wafer inside the transfer chamber 701 to the semiconductor processing chambers 703 to 706, and move the wafers between the semiconductor processing chambers 703 to 706.

The semiconductor processing chambers 703 to 706 may be connected to voltage measuring devices 711 to 741, and the voltage measuring devices 711 to 741 may be connected to control devices 713 to 743. In an example embodiment shown in FIG. 14, the voltage measuring devices 711 to 741 are illustrated as being connected to each of the control devices 713 to 743, but according to example embodiments, two or more of the voltage measuring devices 711 to 741 may be connected to one control device. Meanwhile, the voltage measuring devices 711 to 741 may be connected to one data server 750.

The data server 750 may receive raw data from each of the voltage measuring devices 711 to 741 connected to the semiconductor processing chambers 703 to 706, and control operating parameters of each of the voltage measuring devices 711 to 741 based on the raw data. For example, if there are chambers performing the same semiconductor process under the same conditions among the semiconductor processing chambers 703 to 706, the data server 750 may commonly control operating parameters of the voltage measuring devices connected to the chambers performing the same process. In addition, based on the raw data received from at least one of the chambers performing the same process, operating parameters of all chambers performing the same process may be controlled in common, and in this case, a data throughput of the data server 750 may be reduced.

As set forth above, according to an example embodiment of the present inventive concept, it is possible to detect a voltage corresponding to RF power input through an electrode inside an electrostatic chuck in real time and monitor variations in the voltage to determine whether the voltage increases to be within a predetermined reference range.

When the voltage increases to the predetermined reference range, it may be determined that the electrostatic chuck has deteriorated and an interlock control signal for stopping an operation of a semiconductor processing chamber to replace the electrostatic chuck may be output to the semiconductor processing chamber.

Accordingly, it is possible to minimize stopping the operation of the semiconductor processing chamber, monitor a state of the electrostatic chuck, and improve a yield of a semiconductor process. However, the inventive concept is not limited to these effects or the previously described embodiments.

While example embodiments have been illustrated and described above, it will be apparent to those skilled in the art that modifications and variations could be made without departing from the scope of the present inventive concept as defined by the appended claims.

What is claimed is:

1. A semiconductor processing system, comprising:
    a semiconductor processing chamber including an electrostatic chuck disposed in a chamber housing, and a first power supplier for supplying first radio frequency (RF) power to an internal electrode disposed in the electrostatic chuck;
    a voltage measuring device configured to measure a voltage corresponding to the first RF power and convert the measured voltage to a digital signal based on a parameter; and
    a control device configured to output an interlock control signal to the semiconductor processing chamber to stop an operation of the semiconductor processing chamber, when it is determined that the measured voltage is within a predetermined reference range for longer than a predetermined reference time based on the digital signal, and otherwise continue the operation,
    wherein the electrostatic chuck is configured to enable a wafer to be seated on a surface of the electrostatic chuck,
    wherein the semiconductor processing device adjusts the parameter based on raw data output by the voltage measuring device.

2. The semiconductor processing system of claim 1, wherein the voltage measuring device comprises an RF voltage measuring circuit generating an analog signal by measuring a voltage from the internal electrode, and a signal processor converting the analog signal into the digital signal.

3. The semiconductor processing system of claim 1, wherein the electrostatic chuck comprises a ceramic coating layer configured to contact a surface of the wafer.

4. The semiconductor processing system of claim 1, wherein the first power supplier comprises a first power source, and a first bias matching circuit connected between the first power source and the internal electrode.

5. The semiconductor processing system of claim 4, wherein the voltage measuring device is configured to measure the voltage between the internal electrode and the first bias matching circuit.

6. The semiconductor processing system of claim 1, wherein, the control device measures the voltage from a first time point at which the electrostatic chuck is replaced, and determines that a replacement timing for the electrostatic chuck has arrived, when it is determined that the voltage has increased to the reference range.

7. The semiconductor processing system of claim 6, wherein the control device is configured to output the interlock control signal to the semiconductor processing chamber, when it is determined that a replacement timing of the electrostatic chuck has arrived.

8. The semiconductor processing system of claim 7, wherein the semiconductor processing chamber is configured to stop an operation thereof in response to the interlock control signal.

9. The semiconductor processing system of claim 1, further comprising:
    a data server for receiving raw data corresponding to the digital signal from the voltage measuring device and storing the same.

10. The semiconductor processing system of claim 9, wherein the data server is configured to adjust at least one of a plurality of operating parameters applied to convert the voltage into the digital signal in the voltage measuring device, using raw data received from the voltage measuring device at different times.

11. The semiconductor processing system of claim 10, wherein the operating parameters include at least one of a gain of an amplifier, a filtering band of a filter, an attenuation coefficient of an attenuator, and a full scale voltage of an analog-to-digital converter.

12. The semiconductor processing system of claim 1, wherein plasma is generated above the wafer and the electrostatic chuck, while a semiconductor process is performed in the semiconductor processing chamber.

13. The semiconductor processing system of claim 1, wherein the electrostatic chuck comprises a plurality of protrusions configured to be in direct contact with a lower surface of the wafer, wherein a space formed by the plurality of protrusions and the lower surface of the wafer is configured to be filled with helium gas, while a semiconductor process is performed in the semiconductor processing chamber.

14. The semiconductor processing system of claim 13, wherein the electrostatic chuck comprises a ceramic coating layer, and the plurality of protrusions are included in the ceramic coating layer.

15. A semiconductor processing system, comprising:
- a plurality of semiconductor processing chambers each including a chamber housing, and a radio frequency (RF) power supplier for supplying RF power to an electrode inside the chamber housing;
- a plurality of voltage measuring devices for measuring a voltage corresponding to the RF power from the plurality of semiconductor processing chambers to output a digital signal;
- a plurality of control devices for outputting an interlock control signal to at least one of the plurality of semiconductor processing chambers based on the digital signal; and
- a data server for adjusting at least one of a plurality of operating parameters applied to convert the voltage into the digital signal in each of the plurality of voltage measuring devices based on raw data received from the plurality of voltage measuring devices.

16. The semiconductor processing system of claim 15, wherein the plurality of semiconductor processing chambers are connected to one load lock chamber.

17. The semiconductor processing system of claim 15, wherein at least a portion of the plurality of semiconductor processing chambers are chambers performing different semiconductor processes.

18. The semiconductor processing system of claim 17, wherein the data server is configured to adjust at least one of a plurality operating parameters of the portion of voltage measuring devices in common, by using the raw data received from a portion of the voltage measuring devices connected to a portion of the semiconductor processing chambers performing the same semiconductor process among the plurality of semiconductor processing chambers.

19. A method of controlling a semiconductor processing system, the method comprising:
- performing a semiconductor process by operating a semiconductor processing chamber after replacing an electrostatic chuck;
- detecting, by a voltage measuring device, a voltage corresponding to radio frequency (RF) power supplied to the semiconductor processing chamber, while the semiconductor process is performed;
- converting the voltage into a digital signal based on a parameter;
- stopping an operation of the semiconductor processing chamber when the voltage is determined to be within a predetermined reference range for longer than a predetermined reference time based on the digital signal, and otherwise continuing the operation; and
- adjusting the parameter based on raw data output by the voltage measuring device.

* * * * *